United States Patent [19]

Stickels et al.

[11] Patent Number: 4,622,081
[45] Date of Patent: Nov. 11, 1986

[54] FORMABLE, TEMPERATURE-RESISTANT MARTENSITIC STEEL HAVING ENHANCED RESISTANCE TO WEAR

[75] Inventors: Charles A. Stickels, Ann Arbor; Claude M. Mack, Ypsilanti, both of Mich.

[73] Assignee: Ford Motor Company, Dearborn, Mich.

[21] Appl. No.: 681,723

[22] Filed: Dec. 14, 1984

[51] Int. Cl.$^4$ .............................................. E22C 38/12
[52] U.S. Cl. .................................. 420/111; 428/938; 148/16.5
[58] Field of Search ....................... 148/31.5, 36, 16.5; 75/126 E, 126 C, 123 J; 428/938, 698

[56] References Cited

U.S. PATENT DOCUMENTS

| | | | |
|---|---|---|---|
| 2,206,370 | 7/1940 | Scherer | 75/123 J |
| 2,992,148 | 4/1959 | Yeo et al. | 75/126 C |
| 3,257,200 | 6/1966 | Hodge | 75/126 C |
| 3,600,160 | 8/1971 | Simcoe et al. | 75/126 C |
| 3,954,517 | 5/1976 | Jatczak et al. | 148/36 |
| 4,157,258 | 6/1979 | Philip et al. | 148/31.5 |
| 4,162,157 | 7/1979 | Parker et al. | 148/36 |
| 4,358,317 | 11/1982 | Abe | 148/36 |

Primary Examiner—L. Dewayne Rutledge
Assistant Examiner—Deborah Yee
Attorney, Agent, or Firm—Joseph W. Malleck; Roger L. May

[57] ABSTRACT

An alloy steel composition is disclosed which has characteristics of (a) enhanced resistance to hardness degradation under high temperatures and/or enhanced resistance to sliding wear and contact fatigue under conditions of poor lubrication, (b) ease of softening for formability and machinability, and (c) ease of heat treating for hardening with austenitizing (or carburizing) at a temperature of 950°–960° C. and tempering at a temperature at or below 600° C. The composition comprises essentially, by weight, carbon—0.15–0.30%, Mo—2.-0–3.5%, V—0–0.45%, Cr—0–0.75%, Mn—0.25–0.50%, Si—0.15–0.35%, and remainder Fe.

11 Claims, No Drawings

FORMABLE, TEMPERATURE-RESISTANT MARTENSITIC STEEL HAVING ENHANCED RESISTANCE TO WEAR

TECHNICAL FIELD

This invention relates to martensitic steels of the type that can be heat treated to give secondary hardening, making such steels resistant to softening at high temperatures, and relates to steels which can be heated to a formable and machinable condition prior to hardening heat treatments.

BACKGROUND OF THE INVENTION AND PRIOR ART STATEMENT

Highly alloyed martensitic tool steels have been used on a limited basis in automobile engine and drive-line applications in spite of the fact that they exhibit good strength (hardness) and wear resistance at elevated temperatures. The factors which discourage greater use of such tool steels are: (a) they contain substantial amounts (greater than 4-5%) of alloying ingredients, such as chromium, molybdenum, tungsten, cobalt or vanadium; (b) they are expensive and difficult to heat treat for final hardness requiring temperatures of 1000°-1250° C. for austenization; and (c) they are expensive and difficult to soften for fabrication into parts prior to heat treatment.

Instead, more economical low alloy carburizing steels are commonly used in automotive applications; these steels, however, lack sufficient strength and wear resistance at high temperatures for many applications. Such carburizing steels do not exhibit secondary hardening during tempering, but progressively soften as the tempering or service temperature is increased. Thus, for automotive engine parts which are at times imperfectly lubricated, such as engine valve trains, conventional carburizing steels are not entirely satisfactory. Their wear resistance would be better if they exhibited secondary hardening behavior.

Modifications of carburizing steels have been made by the prior art to make them more temperature resistant, but such modifications have involved adding large amounts of alloying ingredients, substantially to the level of tool steels, and thus suffer from the three disadvantages outlined above for tool steels.

The alloying ingredients of molybdenum, tungsten, vanadium and chromium, which are now known as the result of this invention to be effective in producing secondary hardening when used with proper heat treatment and used in economical controlled amounts, have been used by the prior art, but such use has been consistently in improper amounts and with the wrong associated processing so that the combined benefits of this invention are never realized.

In U.S. Pat. No. 2,992,148, a teaching is made for the making of steel designed to have good magnetic as well as mechanical properties; it also is to be used in a normalized condition after heat treatment, thus making it a bainitic steel rather than a martensitic steel. Although the disclosure suggests the use of molybdenum and vanadium as well as chromium, the molybdenum and vanadium additions are too low in amount and are associated with the wrong thermal processing; significant secondary hardening would not be produced by the normalizing heat treatment described. In addition, such disclosure requires a high nickel content; in our invention, the nickel content should not exceed about 0.25%, the maximum level of nickel usually found as a residual impurity in alloy steels.

In U.S. Pat. No. 2,206,370, there is also a teaching of the use of small amounts of molybdenum and vanadium combined with a high nickel content. Little or no secondary hardening can take place with this alloy because the molybdenum and vanadium contents prescribed for use are too low and the final austenitizing temperature (1500°-1550° F.) is too low for dissolution of alloy carbides.

In U.S. Pat. No. 3,257,200, small additions of vanadium and columbium are made to a 2¼% chromium and 1% molybdenum steel to improve creep strength at elevated temperatures without degrading impact properties. The amount of chromium required is too high in conformity with the teaching of this invention because chromium restricts the solubility of carbon in austenite at 950° C. The molybdenum content is too low for optimum secondary hardening response. 2¼ Cr - 1 Mo steel was designed for creep resistance and is commonly used for boiler tubing in steam power plants and for heat exchanger tubing. Because it was formulated for an entirely different purpose, the mechanical properties of 2¼ Cr - 1 Mo steel after carburizing would be distinctly inferior to the properties of the alloys described in this invention.

SUMMARY OF INVENTION

The invention is an alloy steel characterized by: (a) enhanced resistance to hardening degradation under high temperatures and/or enhanced resistance to sliding wear and contact fatigue under conditions of poor lubrication; (b) ease of softening for forming and machining; and (c) ease of heat treating for hardening. The alloy steel comprises essentially: (a) amounts of carbon, manganese, and silicon associated with a plain, low carbon steel, (b) alloying ingredients, and (c) the remainder Fe, said alloying ingredients consisting essentially of, by weight, 2.0-3.5% Mo, 0-0.45% V, and 0-0.75% Cr. To obtain an annealed, softened condition for said steel with a hardness below 80 Rb to promote formability, the steel comprises essentially the ingredients of, by weight: carbon - 0.15-0.30%, Mo - 2.0-3.5%, V - 0-0.45%, Cr - 0-0.75%, Mn - 0.25-0.50%, Si - 0.15-0.35%, and the remainder essentially Fe. If the steel is to be used where enhanced resistance to sliding wear and contact fatigue under conditions of poor lubrication is important, it is preferable that the alloy steel be carburized at a temperature of 950°-960° C. If the alloy steel is to be used in a process where processing temperatures are experienced at or above 500° C. for short periods of time, the alloy steel resists high temperatures of such processing without degradation of its hardness. If the steel is to be used in applications where an elevated temperature in excess of 250° C. is to be experienced for extended periods of time, the steel will exhibit highly enhanced resistance to hardness degradation under such conditions.

Advantageously, the softening for forming and machining is by a spheroidize anneal at 875°-925° C. followed by slow cooling to about 700° C. and to a level of hardness of less than 80 Rb (Rockwell b scale). Similarly, it is advantageous if the heat treating for hardening is carried out with an austenitizing (or carburizing) temperature of 920°-960° C. followed by tempering at 500°-600° C. for at least two hours to yield a hardness above 50 Rc for the carburized case and above 45 Rc for the core.

Preferably, the vanadium is maintained in the low end of said ingredient range (0.1–0.2%) to obtain the best response to carburizing for said steel. Alternatively, the vanadium may be maintained in the high end of the range (0.3–0.45%) to obtain the best toughness and secondary hardening for said steel. The alloy steel is characterized further by being a martensitic stee with precipitates, primarily, of M₂C (representing an Mo carbide in which Cr and V may substitute for some of the Mo), the latter being resistant to coarsening at a temperature of 550° C. or below.

DETAILED DESCRIPTION AND BEST MODE

The invention is an alloy steel that provides enhanced resistance to sliding wear and contact fatigue under conditions of poor lubrication and/or resistance to hardening degradation under high temperature use or processing. The steel alloy of this invention has some of the attributes of a tool steel, yet is readily softened for machining or forming and does not require high processing temperatures for achieving hardening.

Highly alloyed tool steels of the prior art, such as the M and W series of high speed steels and the H series of hot work die steels, owe their good strength and wear resistance at elevated temperatures to "secondary hardening" during tempering. These steels are tempered after quenching to form martensite and do not progressively soften as the tempering temperature increases as is the case with most alloy steels. Instead, as-quenched hardness of these highly alloyed tool steels is nearly constant for tempering temperatures as high as 600° C. Some of these highly alloyed tool steels actually become harder after tempering at 500°–600° C. than they are as quenched. Thus, a high speed steel used as a cutting tool does not soften even though the frictional heat generated during cutting is sufficient to make the tool red-hot.

The same kind of resistance to frictional heating is advantageous for some automotive part applications which occasionally are imperfectly lubricated such as components of an engine valve train. Although small quantities of highly alloyed tool steels have been used in engine valve trains of some high performance engines, there are several factors which discourage wide-spread use of such highly alloyed tool steels, namely: (1) they contain substantial amounts of expensive alloying elements such as tungsten, molybdenum, vanadium, cobalt and chromium; (2) they are expensive to heat treat, requiring temperatures of 1000°–1250° C. for austenization; and (3) they are expensive and difficult to soften for fabrication into parts.

The steels described in this invention combine some of the attributes of a tool steel with those of a conventional carburizing steel. The alloys exhibit secondary hardening, although not to the same degree as highly alloyed tool steels, yet they can be processed economically much like a typical carburizing steel. The alloy steel of this invention offers the following combination of advantages: good to excellent secondary hardening with ease of heat treatment, ease of softening for formability, and economy both in the use of ingredients and processing. The alloy steel comprises essentially the following ingredients by weight:

| | |
|---|---|
| Carbon | .15–.3% |

| -continued | |
|---|---|
| Mo | 2.0–3.5% |
| V | 0–.45% |
| Cr | 0–.75% |
| Mn | .25–.50% |
| Si | .15–.35% |
| Fe | Remainder |

This steel contains critical amounts of molybdenum and critically lower amounts of vanadium and chromium for secondary hardening. These elements induce secondary hardening at tempering temperatures of 500°–600° C. The precipitates responsible for the hardening are stable and resistant to coarsening, thus hardness is retained even after long exposure at temperatures of up to 550° C. To prevent significant interference with softening, carbon should be limited to 0.3%, Mn to 0.5%, and Si to 0.35%. The lower limits for C, Mn and Si are based on practical processing and the attainment of a martensitic steel.

A preferred method for heat treating such steel for softening is as follows. Pieces of the steel are heated to 875°–925° C. in a furnace with a protective atmosphere, then cooled at 3°–25° C./hr until a temperature of 700° C. is reached. The slower the cooling rate, the lower the hardness will be. A preferred method of heat treating such steel for hardening is to gas carburize for 1–12 hours at 950°–960° C. (preferably 955° C.), followed by oil quenching and tempering. The carburized case depth is greater, the longer the time at the carburizing temperature. For tempering temperatures of 200° C. or less, the case hardness is typically 61–65 Rc and the core hardness is 45–50 Rc. The kinds of apparatus for carrying out the spheroidize anneal and the carburizing, quenching and tempering is generally known and described in Volume 4 of the 9th Edition of the ASM Metals Handbook.

A comparison of the chemical ingredients for the closest known alloy steels is illustrated in Table I, wherein two types of highly alloyed tool and die steel are listed along with four conventional carburizing steels and three temper-resistant carburizing steels which are generally commercially available in the art today. These alloys differ from the alloy of this invention in several respects. They are generally higher in alloy content, they require a temperature of austenitization above 1000° C., and they cannot be easily softened because of their higher alloy content.

Chemistry Variation

Moybdenum, tungsten, vanadium and chromium are used to produce secondary hardening behavior. For ease of heat treatment, it is desirable to limit the austenitizing temperature to about 955° C. (1750° F.). Parts can be processed in conventional carburizing furnaces with conventional process controls with little difficulty at this temperature. In addition, for satisfactory hardening, the microstructure of the alloy must consist of austenite and carbide at this temperature—no ferrite can be present. As much carbon and alloying element as possible must be dissolved in the austenite to produce the maximum secondary hardening response. These factors limit the useful amount of the alloy which can be added. It is evident that the tungsten content must be less than 2.5 weight percent (0.75 atomic percent) to avoid ferrite formation as indicated by the ternary phase diagram in the Metals Handbook, 8th Ed., Vol. 8. Furthermore, the vanadium content must be less than 0.3 weight percent (0.33 atomic percent) because this is as much as can be dissolved in austenite containing one weight percent carbon. The useful molybdenum content, however, is about 2.5 weight percent (1.5 atomic percent) at the one weight percent carbon level and increases to about 3 weight percent if the carbon level is reduced to 0.2 percent. Therefore, molybdenum is a principal alloying ingredient of this invention. As long as at least 0.2 weight percent carbon is present, ferrite formation can be avoided at 955° C., even at molybdenum contents above 3 weight percent.

Softening for Fabrication

Thus, a base alloy containing 0.25% carbon and 3.0% molybdenum with about 0.25% silicon and 0.25% manganese was chosen for a first set of examples to illustrate the advantages of this invention. The first set of examples produce austenite with some undissolved carbides at 955° C.; the undissolved carbides are beneficial in that they prevent grain coarsening.

All of the first set of examples were given several different anneals to determine how readily they softened. The anneals consisted of heating rapidly to an elevated temperature of 875°–925° C., then cooling at rates from 2.5°–75° C./hr. The base alloy of the first set of samples contained 0.25% carbon, 3.0% molybdenum, 0.25% silicon and 0.25% manganese. To these base alloys, sample 1 consisted of adding one percent silicon, sample 2 consisted of adding 0.9% chromium, sample 3 consisted of adding 0.25% vanadium, and sample 4 consisted of adding one percent nickel. As shown in Table II, the base alloy and sample 3 (containing vanadium) softened quite readily to hardnesses below 80 Rb. Sample 2 (containing chromium) was generally slightly higher in hardness while samples 1 and 4 (respectively containing silicon and nickel) were substantially higher in hardness. For purposes of comparison, Table III lists similar data taken from the Metals Handbook, 9th Ed., Vol. 4, for conventional carburizing steels. It is notable that in no instance in Table III is the hardness below Rb 80. Thus, both nickel and silicon, being obvious detriments to softening, are ruled out as constituents of this invention. However, up to 0.25% weight percent of nickel and silicon can be tolerated. Chromium and vanadium, on the other hand, affect the annealing of the steel to a lesser degree.

A second series of alloys with the compositions as shown in Table IV were prepared and the response to annealing investigated. The amounts of molybdenum and vanadium in these alloys were adjusted to maintain the sum of the atom fractions of these elements approximately constant. The alloys contained 0.2% carbon. Lowering the carbon content makes it possible to achieve lower hardness after annealing. Despite the lower carbon content, a temperature of 900° C. is sufficient to eliminate all of the ferrite. The hardness obtained after annealing these alloys is summarized in Table V. Note that the annealed hardnesses are considerably below than the values given in Table II. For best cold formability, the lowest possible hardness is generally desired. Best machinability, on the other hand, is frequently obtained with hardnesses of 80–95 Rb.

Secondary Hardening and Heat Treatment

Each of the first series of samples were carburized at 950° C. for 1.75 hours, quenched in oil, then tempered at various temperatures for two hours. Electron microprobe carbon analyses showed a maximum surface carbon content of 0.9–1.05 weight percent after this treatment. The nickel-bearing steel had the highest surface carbon content while the vanadium-bearing steel had the lowest. In the case of the vanadium-bearing alloy, it contained some larger carbides not reflected in the chemical analyses. Table VI summarizes case and core hardness (derived from microhardness traverses) after tempering for two hours at several temperatures as indicated. The case hardness on a conventional carburizing steel would be on the order of 45 Rc after tempering at 500° C. and below 40 Rc after tempering at 600° C. Note that the decline in core hardness with increasing tempering temperature is less than the decline in case hardness. This suggests that other types of surface hardening treatments such as physical vapor deposition of titanium nitride or nitriding could be given these alloys without degrading the hardness of the core.

With respect to the second series of samples that were prepared, as listed in Table IV, the case and core hardness, after carburizing at 955° C. and oil quenching and tempering for four hours at various temperatures, is given in Table VII. These values are similar to those presented in Table VI. The thermal stability of the carbides formed during secondary hardening can be judged by measuring the hardness after exposure to elevated temperatures for longer times. The data in Table VI shows that neither the case nor core hardness decrease upon increasing the tempering time from 4 to 64 hours at 500° or 550° C. However, both case and core hardness decrease after 64 hours at 600° C. Alloys C and D, which are high in vanadium content, are more resistant to softening than the others, particularly in the core.

From microhardness measurements of case depth after carburizing, it is found that alloys C and D, high in vanadium content, have somewhat shallower effective case depth than the others after the same carburizing treatment.

The energy absorbed on impact at room temperature was measured for the heat treated core material tempered at various temperatures. For tempering temperatures up to 300° C., the energy absorbed on fracture of Charpy V-notch specimens was about 20 ft/lbs for alloys A, B and C and about 30 ft/lbs for alloy D. The impact energy dropped to less than 15 ft/lbs for all alloys after tempering at 550° C. Alloy D, however, exhibited superior properties for the range of tempering temperatures from 150°–500° C.

Thus, the alloys of this invention, having the compositions in the ranges described earlier, are readily softened by spheroidized anneal to a hardness of less than 80 Rb, and upon carburizing, oil quenching and tempering at 600° C., a case hardness above 50 Rc and a core hardness above 45 Rc are obtained. For most applications, tempering temperatures of 150°–200° C. would be used to provide a higher case hardness. This alloy is intended for applications in which wear resistance is the primary concern and in which lubrication may be marginal. The composition of the alloy may be adjusted within these ranges to suit the requirements of the specific application. For example, for ease of annealing and the best response to carburizing, the vanadium content should be kept low. On the other hand, the best toughness and the best resistance to softening at elevated temperatures is found when the vanadium content is at the high end of the specified range (0.3–0.45%).

Applications

The alloys of this invention are specifically suited for being carburized for applications in which resistance to wear is the primary concern. The alloys of this invention offer an advantage over conventional carburized steels for any application in which lubrication can become marginal. Intermittent metal-to-metal contact produces local surface heating which will soften the surface of conventional steels, making them less able to resist subsequent metal-to-metal contact. It is sometimes difficult to assure adequate lubrication of the components of engine valve trains for all modes of engine operation. The alloys of this invention would be suited for rocker arms, wear surfaces on valve lifters, push rods and camshafts. In CVT transmissions of the variable pulley type, torque is transmitted by friction between the chain and the pulley. Carburized steels have been used for elements of the chain and for the pulley. Any slippage of the chain due to sudden increases or decreases in torque requirements will cause heating of the mating surfaces. The steel of this invention, with improved resistance to softening at elevated temperatures, would be more tolerant of such small amounts of slippage.

Physical vapor deposition of titanium nitride has been successful in coating high speed steel cutting tools. These steels do not soften during the coating treatment. Although the surface temperature reached during coating can vary widely, coating adherence is usually better at high temperatures. It is likely that in most cases temperatures of 500° C. are attained. Wear resistant heat treated steels such as 4140, 5160, 52100, etc., which are commonly used for automotive parts, would soften to 35-40 Rc after exposure to 500° C. Steels of this invention would maintain 45-50 Rc during treatment, the hardness depending on the carbon content. The titanium nitride coating does not increase appreciably the resistance of steels to indentation; therefore, the higher the strength, the greater the contact stresses which can be supported. Titanium nitride coated steels of this invention are potentially useful in many power train application such as piston rings, valve train components, and shafts.

Nitriding, particularly ion nitriding, is receiving increased attention as the means for surface hardening steels for wear resistance. Temperatures of 525°-575° C. are required during processing for times of 2-6 hours. Longer times produce deeper cases, but are often not economical. Since the nitrided case is usually about 0.1-0.25 millimeters in thickness, it cannot itself support high contact loads. The magnitude of the contact load which can be supported depends primarily on the strength of the substrate. Accordingly, the steels of this invention, which do not soften during nitriding, are desirable; applications include shafts, valve train components, and some gears.

Certain applications require elevated temperature strength. Secondary hardening steels have better resistance to creep and stress relaxation at elevated temperatures than steels which do not precipitate alloy carbides during tempering. Therefore, they are suited for engine components such as springs and fasteners which are statically loaded and exposed to temperatures well above ambient. The carbon and low alloy steels available for valve springs and fasteners as sold in commercial channels today are adequate for current engines. However, if operating temperatures in new engines should exceed 250° C., the inventive material herein would be required. A stainless steel, such as AISI 302, would be a commercially available, but high cost, choice for meeting this application, whereas the cost of the present invention can be one-half to two-thirds that of stainless steel. The carbon content of the secondary hardening steel can be adjusted for the application. For fasteners a carbon content of 0.15 would produce a steel of the proper hardness; for springs a carbon content of 0.3 would be necessary.

TABLE I

COMMERCIAL STEEL COMPOSITIONS

|  | C | Mn | Si | Cr | Ni | Mo | V | W | Cu |
|---|---|---|---|---|---|---|---|---|---|
| Tool & Die Steels | | | | | | | | | |
| M-2 | 0.85 | 0.30 | 0.30 | 4.0 | | 5.0 | | 6.0 | |
| H-12 | 0.35 | 0.30 | 0.30 | 5.0 | | 1.50 | 0.40 | 1.30 | |
| Conventional Carburizing Steels | | | | | | | | | |
| 5120 | 0.20 | 0.80 | 0.25 | 0.80 | | | | | |
| 8620 | 0.20 | 0.80 | 0.25 | 0.50 | 0.55 | 0.20 | | | |
| 4820 | 0.20 | 0.60 | 0.25 | | 3.50 | 0.25 | | | |
| 9310 | 0.10 | 0.55 | 0.25 | 1.25 | 3.25 | 0.10 | | | |
| Temper-Resistant Carburizing Steels | | | | | | | | | |
| CBS 1000 M | 0.13 | 0.50 | 0.50 | 1.10 | 3.0 | 4.5 | 0.35 | | |
| VASCO X-2 | 0.16 | 0.31 | 1.00 | 4.90 | | 1.4 | 0.45 | 1.36 | |
| EX-53 | 0.11 | 0.38 | 1.00 | 1.00 | 2.0 | 3.15 | | 2.0 | |

TABLE II

Hardness Measured After Various Annealing Cycles

| Sample | | Cycle A* | Cycle B* | Cycle C* |
|---|---|---|---|---|
|  | Base Alloy | 85 Rb | 77 Rb | 75 Rb |
| 1 | +1% Si | 93 | 90 | 87 |
| 2 | +0.9% Cr | 91 | 81 | 78 |
| 3 | +0.25% V | 90 | 78 | 76 |
| 4 | +1% Ni | 93 | 82 | 82 |

*All samples were normalized from 1025° C., then heated as follows:
A: 4 hours 750° C., air cool.
B: 20 minutes 925° C., cooled at 60° C./hr to 870° C., at 30° C./hr from 870 to 788° C., at 15° C./hr from 788 to 760° C., at 7.5° C./hr from 760° to 677° C., air cool.
C: 1 hour 925° C., cooled at 20° C./hr to 870° C., at 10° C./hr from 870 to 788° C., at 5° C./hr from 788 to 760° C. and at 2.5° C./hr from 760 to 677° C., air cool.

TABLE III

Hardness of Annealed and Normalized Carburizing Steels

|  | Annealed | Normalized |
|---|---|---|
| 8620 | 149 HB (80 Rb) | 183 HB (91 Rb) |
| 4820 | 197 (93) | 229 (98) |
| 9310 | 241 (100) | 269 (104) |

TABLE IV

| | Compositions of Second Series | | | | | |
|---|---|---|---|---|---|---|
| Alloy | C | Mn | Si | Cr | Mo | V |
| A | 0.21 | 0.31 | 0.20 | 0.61 | 2.92 | 0 |
| B | 0.21 | 0.31 | 0.22 | 0.61 | 2.62 | 0.15 |
| C | 0.21 | 0.30 | 0.22 | 0.61 | 2.31 | 0.30 |
| D | 0.21 | 0.32 | 0.20 | 0.62 | 2.02 | 0.45 |

TABLE V

| | Hardness, Rockwell B, After Annealing* | | |
|---|---|---|---|
| | Cooling Rate | | |
| Alloy | 12° C./hr | 6° C./hr | 3° C./hr |
| A | 74 | 72 | 71 |
| B | 76 | 72 | 71 |
| C | 77 | 74 | 74 |
| D | 78 | 75 | 74 |

*2 hours 900° C., cooled at the indicated rate to 700° C.

TABLE VI

| | Case and Core Hardness* After Tempering | | | |
|---|---|---|---|---|
| Alloy | 150° C. | 500° C. | 600° C. | 625° C. |
| Case** | | | | |
| Base Alloy | 62 Rc | 54 Rc | 51 Rc | 39 Rc |
| +1% Si | 62 | 52 | 48 | 36 |
| +0.9% Cr | 62 | 54 | 51 | 42 |
| +0.25% V | 60 | 51 | 51 | 41 |
| +1% Ni | 61 | 53 | 48 | 37 |
| Core | | | | |
| Base Alloy | 47 | 43 | 46 | 36 |
| +1% Si | 46 | 43 | 43 | 32 |
| +0.9% Cr | 47 | 44 | 44 | 34 |
| +0.25% V | 46 | 44 | 48 | 43 |
| +1% Ni | 47 | 45 | 45 | 34 |

*Converted to Rockwell "C" from Rockwell Microficial Hardness.
**Measured 0.010" below the surface.

We claim:

1. A hybrid martensitic tool steel/carburizing steel characterized by (i) enhanced resistance to hardening degration under high temperatures, (ii) ease of softening for formability and machinability, and (iii) ease of heat treating for secondary hardening, consisting essentially of: (a) amounts of carbon, manganese, and silicon associated with a plain, low carbon steel with Si in the range of 0.15-0.35% and Mn 0.25-0.5%, (b) alloying ingredients, and (c) the remainder essentially Fe, said alloying ingredients consisting essentially of, by weight, 2.0-3.5% Mo, 0-0.45% V, and 0-0.75 Cr, said steel being characterized by a martensitic matrix with the predominant carbides being precipitates of $M_2C$ resistant to coarsening at 50° C. or lower where M represents molybdnum or molybdenum in combination with minimum amounts of Cr and/or V.

2. The alloy steel as in claim 1, in which said steel is further characterized by enhanced resistance to sliding wear and contact fatigue under conditions of poor lubrication and high temperature, said steel having been carburized at a temperature of 950°-960° C.

3. The alloy steel as in claim 1, in which said steel has been subjected to a vapor deposition coating treatment at or above 500° C. for short periods of time, said steel exhibiting a stable hardness during such coating with a case being at or above 50 Rc and a core at or in excess of 45 Rc.

4. The alloy steel as in claim 1, in which said steel has been softened by a spheroidize anneal at temperatures of 875°-925° C. followed by slow cooling to 700° C., said softened steel having a hardness of 80 $R_b$ or less.

5. The alloy steel as in claim 1, said steel has been heat treated by carburizing at 920°-960° C. and tempering to a temperature in the range of 500°-600° C. for at least two hours to obtain a hardness of said steel at or above 50 Rc in the case and at or above 45 Rc in the core.

6. The alloy steel as in claim 1, said steel has been heat treated by carburizing at 950°-960° C., oil quenching and tempering to a temperature in the range of 150°-200° C. while maintaining the case hardness of said steel at or above 61 Rc and the core hardness at or above 45 Rc.

7. The alloy steel as in claim 5, in which said tempering is carried out for up to four hours and the tempered steel exhibits a hardness is in excess of 50 Rc.

8. The alloy steel as in claim 1, in which said vanadium is restricted to 0.1-0.2% to increase the response to carburizing.

9. The alloy steel as in claim 1, in which said vanadium is restricted to 0.3-0.45% to increase toughness and secondary hardening of the steel.

10. An anneled, formable alloy steel useful for subsequent carburizing, tempering and quenching to form a martensitic alloy steel that is wear resistant and temperature resistant, the formable alloy steel consisting essentially of: (a) amounts of carbon, manganese and silicon associated with a plain, low carbon steel, with Si in the range of 0.15-0.35% by weight and Mn in the range of 0.25-0.5% by weight; (b) alloying ingredients; and (c) the remainder essentially iron, said alloying ingredients consisting essentially of, by weight, 2.0-3.5% Mo, 0-0.45% V, and 0-0.75% Cr, the said steel having a hardness of 80 $R_b$ or below said steel being characterized by a martensitic matrix with the predominant carbides being precipitates of $M_2C$ resistant to coarsening at 550? C. or lower where M represents molybdenum or molybdenum in combination with minimum amounts of Cr and/or V.

11. A carburized, quenched and tempered martensitic alloy steel that maintains wear resistance and core hardness above 45 $R_c$ after exposure to elevated temperatures, said steel consisting of: (a) amounts of carbon, manganese and silicon associated with a plain, low carbon steel, with Si in the range of 0.15-0.35%, Mn 0.25-0.5%, and Cr 0.15-0.3%, by weight, (b) alloying ingredients, and (c) the remainder essentially iron, said alloying ingredients consisting essentially of, by weight, 2.0-3.5% Mo, 0.45% V, and 0-0.75% Cr, said steel being characterized by a martensitic matrix with the predominant carbides being precipitates of molybdenum or molybdenum in combination with minor amounts of chromium and/or vanadium.

* * * * *